US009947532B2

(12) United States Patent
Holt et al.

(10) Patent No.: US 9,947,532 B2
(45) Date of Patent: Apr. 17, 2018

(54) FORMING ZIG-ZAG TRENCH STRUCTURE TO PREVENT ASPECT RATIO TRAPPING DEFECT ESCAPE

(71) Applicant: GLOBALFOUNDRIES Inc., Grand Cayman (KY)

(72) Inventors: Judson R. Holt, Wappingers Falls, NY (US); Shogo Mochizuki, Clifton Park, NY (US); Alexander Reznicek, Troy, NY (US); Melissa A. Smith, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/425,338

(22) Filed: Feb. 6, 2017

(65) Prior Publication Data

US 2017/0148661 A1    May 25, 2017

Related U.S. Application Data

(62) Division of application No. 14/578,523, filed on Dec. 22, 2014, now Pat. No. 9,601,565.

(51) Int. Cl.
*H01L 21/00* (2006.01)
*H01L 21/20* (2006.01)
(Continued)

(52) U.S. Cl.
CPC .. *H01L 21/02639* (2013.01); *H01L 21/02458* (2013.01); *H01L 21/02546* (2013.01);
(Continued)

(58) Field of Classification Search
CPC ........... H01L 21/7605; H01L 21/02549; H01L 21/30625; H01L 21/3065; H01L 21/02639;
(Continued)

(56) References Cited

U.S. PATENT DOCUMENTS 5,463,254 A    10/1995 Iyer et al.
6,642,596 B2   11/2003 Hong
(Continued)

OTHER PUBLICATIONS

Li et al.; "Monolithic Integration of GaAs/InGaAs Lasers on Virtual Ge Substrates via Aspect-Ratio Trapping"; Journal of the Electrochemical Society; 156 (7) H574-H578; 0013-4651/2009/156(7)/H574/5; Copyright The Electrochemical Society.
(Continued)

*Primary Examiner* — Shouxiang Hu
(74) *Attorney, Agent, or Firm* — Younmin Cai; Hoffman Warnick, LLC

(57) ABSTRACT

A method of fabricating a semiconductor device can include the following steps: (i) providing an initial sub-assembly including a trench-defining layer having a top surface; (ii) refining the initial sub-assembly into a first trench-cut intermediate sub-assembly by removing material to form an upper tier of a trench extending downward from the top surface of the trench-defining layer, the upper tier of the trench including two lateral trench surfaces and a bottom trench surface; and (iii) refining the first trench-cut intermediate sub-assembly into a second trench-cut intermediate sub-assembly by selectively removing material in a downwards direction starting from the bottom surface of the trench to form a lower tier of the trench, with the selective removal of material leaving at least a first defect blocking member in the lower tier of the trench.

12 Claims, 8 Drawing Sheets

(51) Int. Cl.
  *H01L 21/02*    (2006.01)
  *H01L 21/76*    (2006.01)
  *H01L 29/06*    (2006.01)
  *H01L 21/3065*  (2006.01)
  *H01L 21/306*   (2006.01)
  *H01L 21/762*   (2006.01)

(52) U.S. Cl.
  CPC .. *H01L 21/02549* (2013.01); *H01L 21/02636* (2013.01); *H01L 21/02647* (2013.01); *H01L 21/2022* (2013.01); *H01L 21/3065* (2013.01); *H01L 21/30625* (2013.01); *H01L 21/7605* (2013.01); *H01L 21/76248* (2013.01); *H01L 21/76294* (2013.01); *H01L 29/0642* (2013.01)

(58) Field of Classification Search
  CPC ........... H01L 21/02546; H01L 29/0642; H01L 21/02647; H01L 21/02458; H01L 21/02636; H01L 21/2022; H01L 21/76248; H01L 21/76294
  USPC .................................. 438/478, 44, 413, 481
  See application file for complete search history.

(56) References Cited

U.S. PATENT DOCUMENTS

| | | | |
|---|---|---|---|
| 6,881,633 | B2 | 4/2005 | Hokazono |
| 6,900,109 | B2 | 5/2005 | Onishi et al. |
| 8,173,551 | B2 | 5/2012 | Bai |
| 2002/0168844 | A1* | 11/2002 | Kuramoto ............... C30B 25/02 438/604 |
| 2003/0155586 | A1 | 8/2003 | Koide |
| 2007/0267722 | A1 | 11/2007 | Lochtefeld |
| 2008/0099785 | A1* | 5/2008 | Bai ....................... C30B 25/183 257/190 |
| 2008/0257409 | A1 | 10/2008 | Li |
| 2012/0199876 | A1 | 8/2012 | Bai et al. |
| 2013/0233238 | A1 | 9/2013 | Vincent |
| 2013/0273721 | A1 | 10/2013 | Wang et al. |
| 2014/0159144 | A1 | 6/2014 | Cheng |

OTHER PUBLICATIONS

Rub et al.; "A Novel Trench Concept for the Fabrication of Compensation Devices"; ISPSD 2003; Apr. 14-17; Cambridge, UK; pp. 203-206.

* cited by examiner

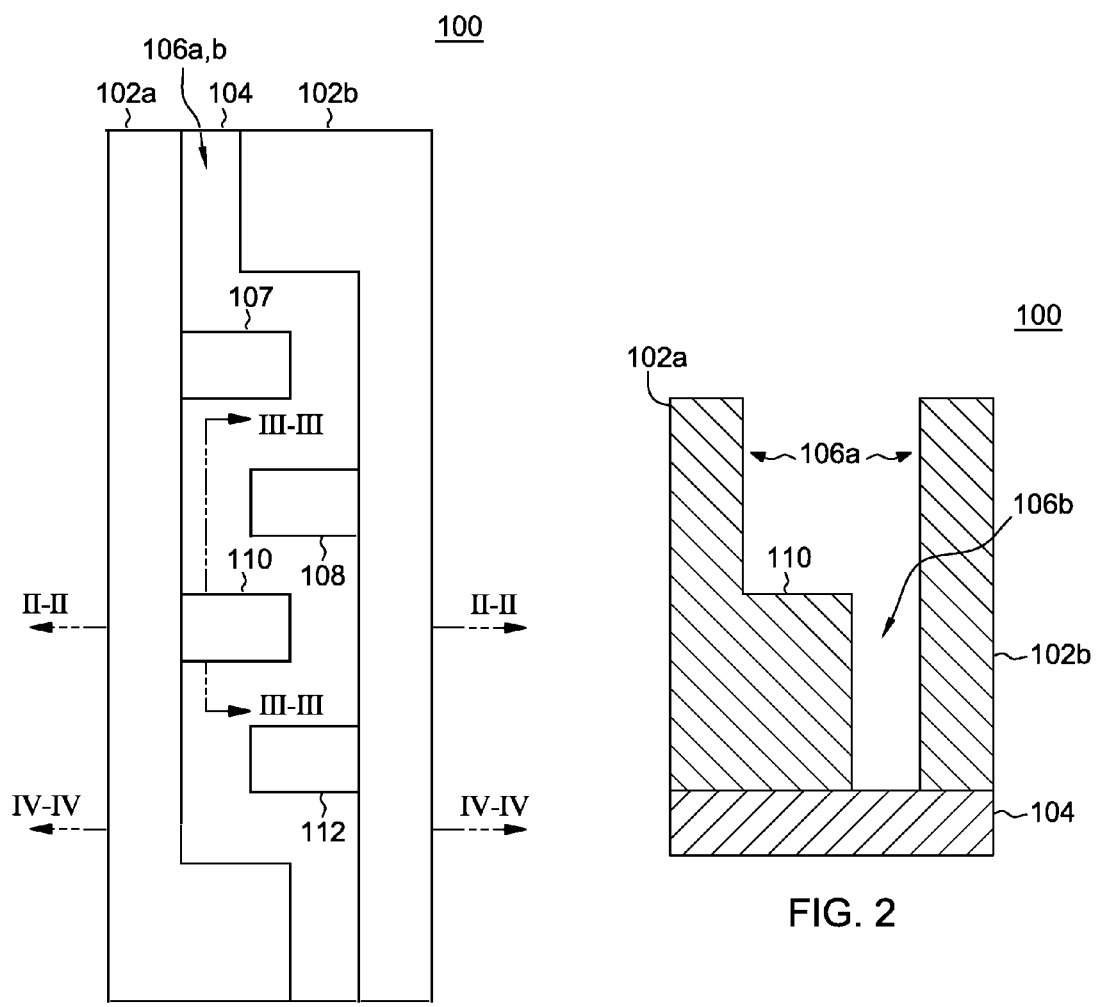

US 9,947,532 B2

FORMING ZIG-ZAG TRENCH STRUCTURE TO PREVENT ASPECT RATIO TRAPPING DEFECT ESCAPE

CROSS-REFERENCE TO RELATED APPLICATIONS

This application is a divisional of currently pending U.S. patent application Ser. No. 14/578,523 filed on Dec. 22, 2014. The application identified above is incorporated herein by reference in its entirety for all that it contains in order to provide continuity of disclosure.

BACKGROUND OF THE INVENTION

The present invention relates generally to the field of field-effect transistors (FETs, NFETs, PFETs), and more particularly to trench structures, for FETs, with relatively large lattice mismatch in their constituent materials.

III-V semiconductors have larger lattice constants than silicon, so integrating them on silicon is challenging. Methods for integrating III-V semiconductors on silicon have included blanket III-V growth and aspect ratio trapping (ART). Many semiconductor materials, such as silicon (Si) have, at the atomic level, a lattice structure. When two different semiconductor materials are intermingled, or placed in close proximity, it is generally better if the lattice constants of the two semiconductor materials are compatible, as such compatibility is understood by those of skill in the art. Aspect ratio trapping is an effective technique to trap threading dislocations, thereby reducing the dislocation density of lattice mismatched materials grown on silicon. The ART technique can be performed using thinner III-V layers. Trenches are employed for trapping misfit threading dislocations by stopping their propagation. The III-V material is grown in narrow trenches. The dislocations end at the trench walls, but fairly high defect densities up to $100,000,000/cm^2$ can still be observed. The present invention shows a structure to further reduce those defect densities. The performance of devices fabricated using dissimilar semiconductor materials can be materially affected by defects that cause abrupt changes in electrical and/or optical properties. Adverse effects due to misfit defects and threading dislocations should be minimized or avoided in the fabrication of electronic devices incorporating such semiconductor materials.

NFETs made using silicon and III-V compounds are known, best known is InGaAs. III-V materials are chemical compounds with at least one group III (IUPAC (International Union of Pure and Applied Chemistry) group 13) element and at least one group V element (IUPAC group 15). NFETs are considered a high performance option for future technology nodes (7 nm (nanometers) and beyond). Co-integration of III-V with silicon deals with a known challenge due to the high lattice mismatch of some III-V semiconductor materials and silicon (and germanium (Ge) and silicon-germanium (SiGe)). Aspect ratio trapping (ART) is a known technique that can be used to counter and/or overcome lattice mismatch issues. In currently conventional ART structures, trenches with parallel sidewalls are formed.

NFETs conventionally include trench structures that use III-V semiconductor material, with high electron mobility, such as GaAs (gallium arsenide), InGaAs (indium gallium arsenide) or InAs (indium arsenide). Some conventional PFETs also include trench structures that use III-V semiconductor material, like InGaSb (indium gallium antimonide), which has a high hole mobility.

SUMMARY

According to an aspect of the present invention, there is a semiconductor structure including: (i) a trench-defining layer; (ii) an epitaxial layer; and (iii) a set of defect-blocking member(s) including at least one defect-blocking member. The epitaxial layer is formed by epitaxial growth. The trench-defining layer includes a trench surface which defines an elongated trench interior space. Each defect-blocking member of the set of defect-blocking members extends from the trench surface into the trench interior space. The epitaxial layer is located in the portions of the trench interior space not occupied by the set of defect-blocking member(s).

According to a further aspect of the present invention, a method of at least partially fabricating a semiconductor device includes the following steps (not necessarily in the following order): (i) providing an initial sub-assembly including a trench-defining layer having a top surface; (ii) refining the initial sub-assembly into a first trench-cut intermediate sub-assembly by removing material to form an upper tier of a trench extending downward from the top surface of the trench-defining layer, the upper tier of the trench including two lateral trench surfaces and a bottom trench surface; and (iii) refining the first trench-cut intermediate sub-assembly into a second trench-cut intermediate sub-assembly by selectively removing material in a downwards direction starting from the bottom surface of the trench to form a lower tier of the trench, with the selective removal of material leaving at least a first defect blocking member in the lower tier of the trench.

According to a further aspect of the present invention, a field-effect transistor (FET) device includes: (i) a FET components set including a first gate and a first contact; (ii) trench-defining layer; (iii) an epitaxial layer; and (iv) a set of defect-blocking member(s) including at least one defect-blocking member. The epitaxial layer is formed by epitaxial growth. The trench-defining layer includes a trench surface which defines an elongated trench interior space. Each defect-blocking member of the set of defect-blocking members extends from the trench surface into the trench interior space. The epitaxial layer is located in the portions of the trench interior space not occupied by the set of defect-blocking member(s). The FET components set are located at least partially on top of a top surface of the epitaxial layer.

BRIEF DESCRIPTION OF THE DRAWINGS

FIG. 1 is an orthographic top view of a first embodiment of a semiconductor structure according to the present invention as it is undergoing fabrication.

FIG. 2 is a transverse cross-sectional view (specifically a cross-sectional slice view showing only material present in the cutting plane shown on FIG. 1) of the first embodiment semiconductor structure under fabrication.

DETAILED DESCRIPTION

Some embodiments of the present invention are directed to techniques for addressing defect issues in the manufacture of devices employing semiconductor materials having dissimilar properties, such as dissimilar lattice constants.

Some embodiments of the present invention recognize the following facts, potential problems and/or potential areas for improvement with respect to the current state of the art: the use of parallel trenches in ART style FETs leads to the problem of defects parallel to the direction of elongation of the trench "escaping." More specifically, the recognized risk is that the semiconductor material used to fill the trench can, during its epitaxial growth inside the interior space of the trench, develop defects that propagate in a direction that is parallel, or at least generally parallel, to the direction of elongation of the trench. While the side walls that help define the trench will arrest defect propagation in a direction transverse, or at least generally transverse, to the trench, in conventional FETs, a defect running generally in the longitudinal direction can propagate as the epitaxial semiconductor material layer is grown up inside the interior space of the trench.

Some embodiments of the present invention are directed to a semiconductor device including: trench-defining layer; an epitaxial layer; and a set of defect-blocking member(s). The trench-defining layer includes a trench surface which defines an interior space (sometimes herein called the trench). The trench-defining layer may include a base sub-layer and a lateral-wall sub-layer, and these sub-layers may be made of different materials. The epitaxial layer is grown epitaxially in the interior space of the trench. Each defect blocking member of the set of defect blocking member(s): (i) extends from a portion of trench surface into the interior space of the trench; and (ii) is located below a top surface of the epitaxial layer. The defect blocking member(s) are designed to arrest the propagation of generally-longitudinal defects in the epitaxial layer, as it is grown, where the generally-longitudinal defects are defects that propagate at least generally in the elongation direction of the trench. The entire trench can be patterned with fins, if desired.

Figure 13:
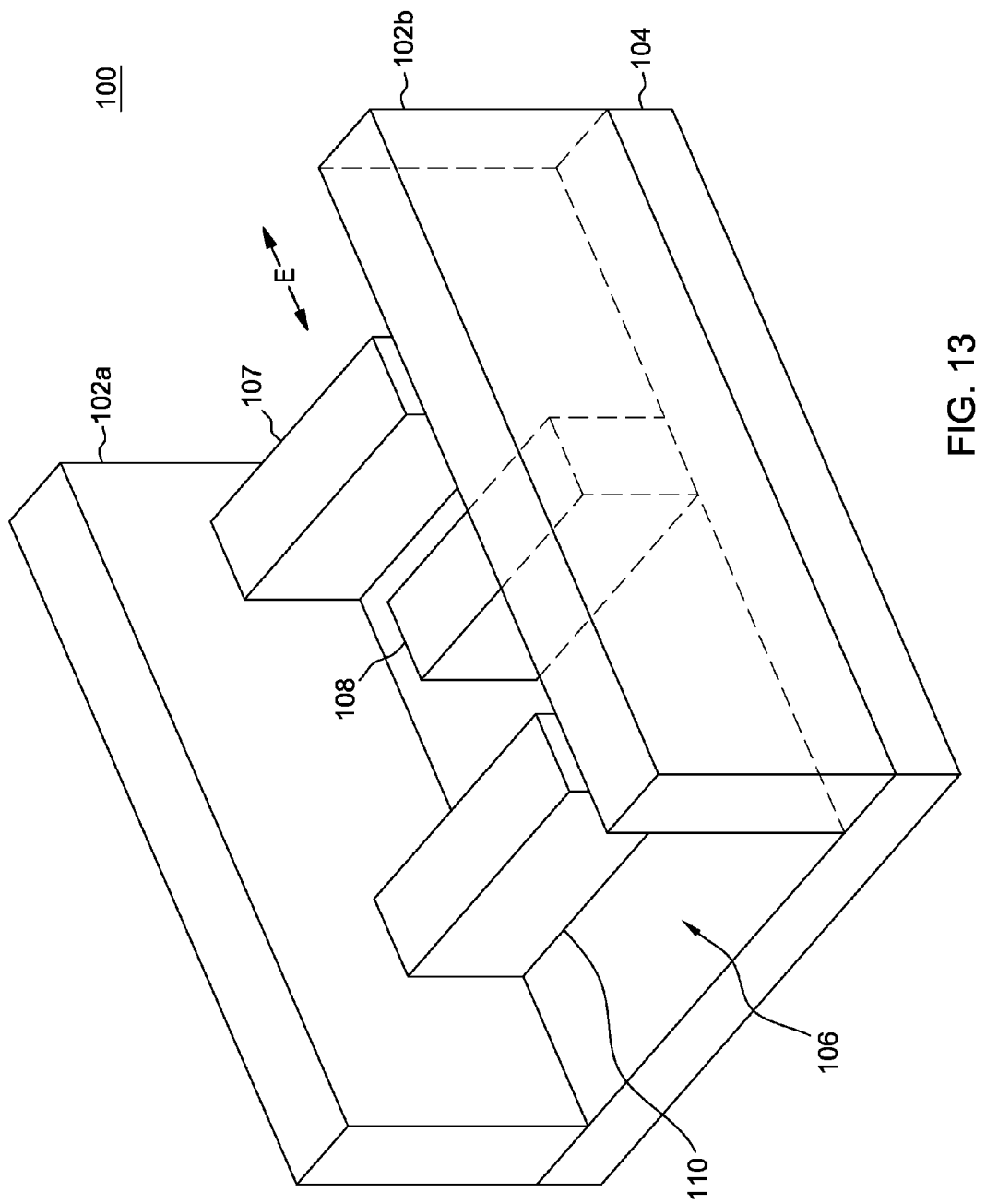
FIG. 13 is a perspective view of the first embodiment semiconductor structure as it exists as the FIG. 1 stage of fabrication.

FIGS. 1 to 13 show semiconductor device 100, 200, 300 as it exists at three stages of the fabrication process, specifically: (i) trench-cut intermediate sub-assembly 100 (see FIGS. 1 to 4 and 13); (ii) epitaxially-grown intermediate sub-assembly 200 (see FIGS. 5 to 8); and (iii) planarized intermediate sub-assembly 300 (see FIGS. 9 and 10). Before going into a detailed discussion, the reader's attention is first drawn to FIG. 13, which is a perspective view that shows defect-blocking members 107, 108, 110 in an easy to understand way. These defect blocking members block propagation of defects that run generally in the elongation direction E of trench 106.

As shown in FIGS. 1 to 4 and 13, trench-cut intermediate sub-assembly 100 includes: lateral wall sub-layer 102 (including first lateral wall portion 102a and second lateral wall portion 102b, first defect-blocking member 107, second defect-blocking member 108, third defect-blocking member 110 and fourth defect-blocking member 112); base sub-layer 104; and trench interior space (also called, more simply, "trench") 106 (including upper trench portion 106a and lower trench portion 106b). Taken together, lateral sub-wall layer 102 and base sub-layer 104 make up an "aspect ratio trapping trench-defining layer" 102, 104. The interior space of trench 106 is defined by the trench-facing surfaces of sub-layer 102 and sub-layer 104 (as is best seen with reference to the perspective view of FIG. 13).

In this example, base sub-layer 104 is made of silicon substrate material and is 875 micrometer thick based on use for a 300 mm (millimeter) wafer (825 micrometer for a 200 mm silicon wafer). When the FET device is finished, the role of base sub-layer 104 is to hold the device in place—it serves as the base of an integrated circuit chip.

In this example, lateral wall sub-layer 102 is made of material suitable for defining an aspect ratio trapping trench (such as dielectric materials, like silicon oxide or nitride), and has a thickness appropriate to an aspect ratio trapping trench.

In this example, defect-blocking members 107, 108, 110, 112 are formed to be of the same material and unitary with lateral wall sub-layer 102. More specifically, trench 106 and defect-blocking members 107, 108, 110, 112 are formed and shaped by performing reactive ion etching on a flat, planar layer of the lateral wall material. Even more specifically, in order to form the trench and defect-blocking members of trench-cut intermediate sub-assembly 100: (i) the top surface is masked off except for an elongated and straight path where upper portion (or tier) 106a of trench 106 will be removed; (ii) upper tier 106a of trench 106 is formed by reactive ion etching (in this example, upper tier 106a has a depth equal to about half of the total depth of trench 106); (iii) the top surface of the lateral wall material that is inside the trench is further selectively masked off (that is, masks are placed according to the plan view footprints of the defect-members to be formed); (iv) lower tier 106a of trench 106 is formed by further reactive ion etching; and (v) the masking is removed to yield trench-cut intermediate sub-assembly 100.

In this example, the lower tier 106b of trench 106 can be described as "zig-zag" because of the pattern formed by the defect blocking members.

As shown in FIGS. 5 to 8, epitaxially-grown intermediate sub-assembly 200 includes: lateral wall sub-layer 102; base sub-layer 104; defect-blocking members 108, 110; and epitaxial layer 202.

In this example, epitaxial layer 202 is made of a III-V semiconductor material, specifically GaAs. Alternatively, any material (now known or to be developed in the future) to which an aspect ratio trapping trench is applicable could be used (for example, other III-V semiconductor materials such as, InGaAs, GaAs, or InGaAs. Epitaxial layer 202 is epitaxially grown to an extent that epitaxial layer 202 substantially fills trench 106, at least up to the height of lateral walls 102a, b. When the aspect ratio trapping trench structure is finished, the epitaxial layer can be used in fabricating semiconductor devices, such as NFETs and PFETs, as will be understood by those of skill in the art. The epitaxial growth techniques used to form epitaxial layer 202 may be any epitaxial growth of semiconductor material techniques currently conventional or to be developed in the future. However, the epitaxial growth of this embodiment of the present invention is less subject to large scale defects than conventional epitaxial growths, grown in epitaxial aspect ratio trapping trenches having no defect blocking members.

Figure 3:
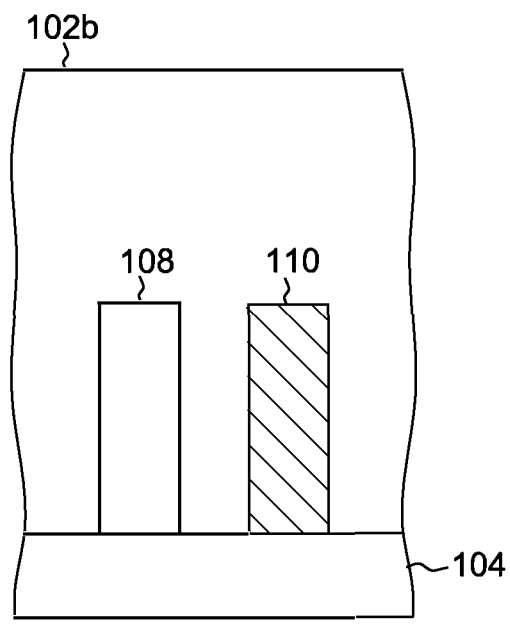
FIG. 3 is a longitudinal cross-sectional view of a portion of the first embodiment semiconductor structure under fabrication.
Figure 4:
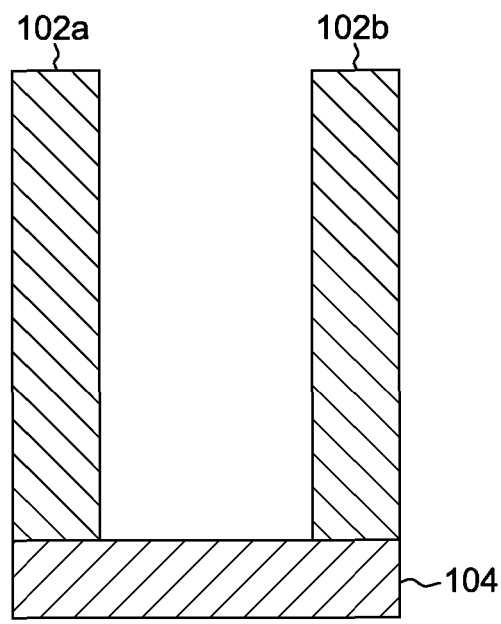
FIG. 4 is another transverse cross-sectional view (specifically a cross-sectional slice view showing only material present in the cutting plane shown on FIG. 1) of the first embodiment semiconductor structure under fabrication.
Figures 5, 6:
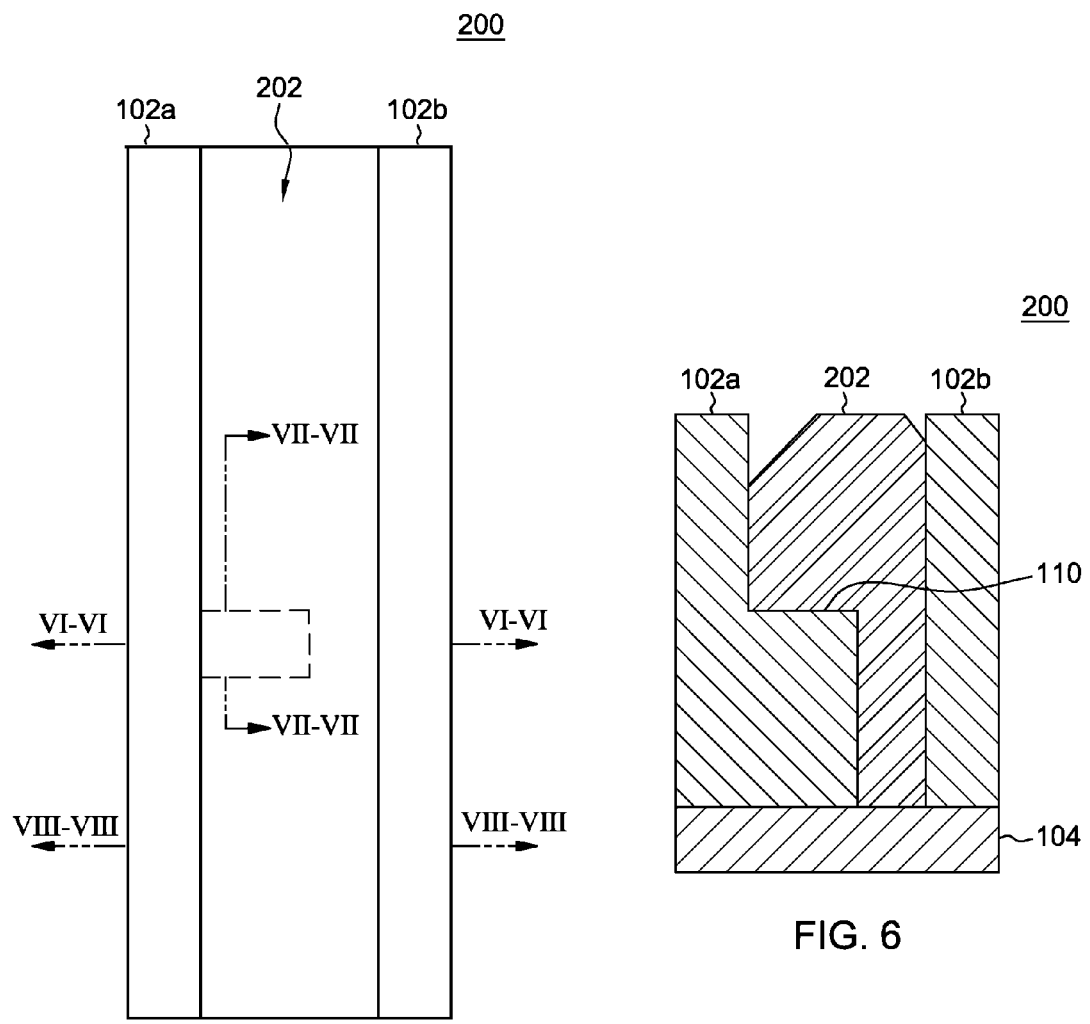
FIG. 5 is an orthographic top view of a first embodiment of a semiconductor structure according to the present invention as it is undergoing further fabrication.
FIG. 6 is a transverse cross-sectional view (specifically a cross-sectional slice view showing only material present in the cutting plane shown on FIG. 5) of the first embodiment semiconductor structure as it is undergoing further fabrication.
Figure 7:
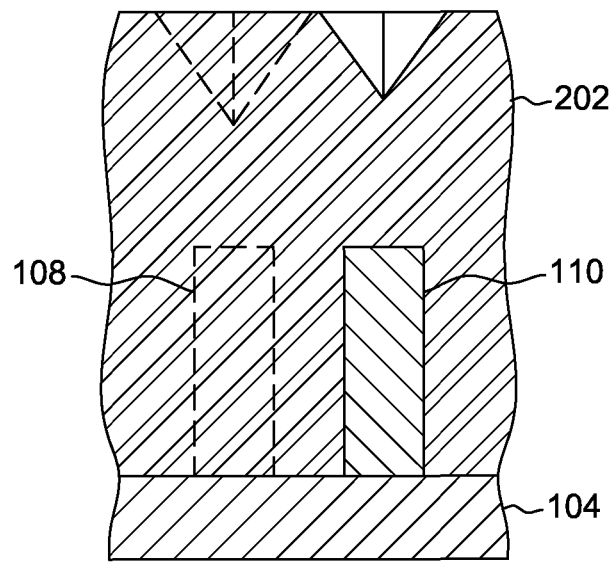
FIG. 7 is a longitudinal cross-sectional view of a portion of the first embodiment semiconductor structure as it is undergoing further fabrication.
Figure 8:
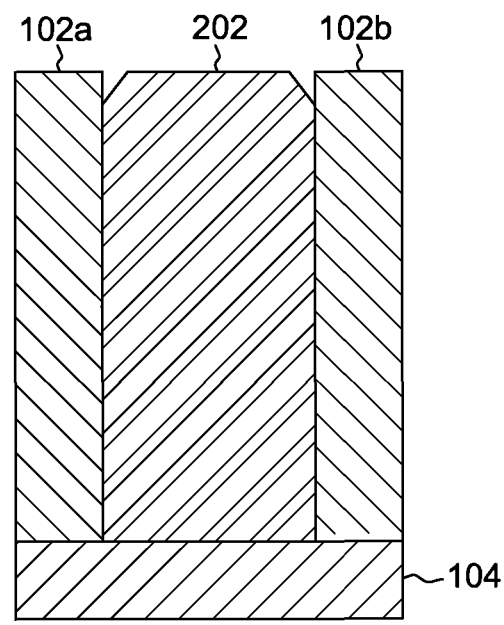
FIG. 8 is another transverse cross-sectional view (specifically a cross-sectional slice view showing only material present in the cutting plane shown on FIG. 5) of the first embodiment semiconductor structure as it is undergoing further fabrication.
Figures 9, 10:
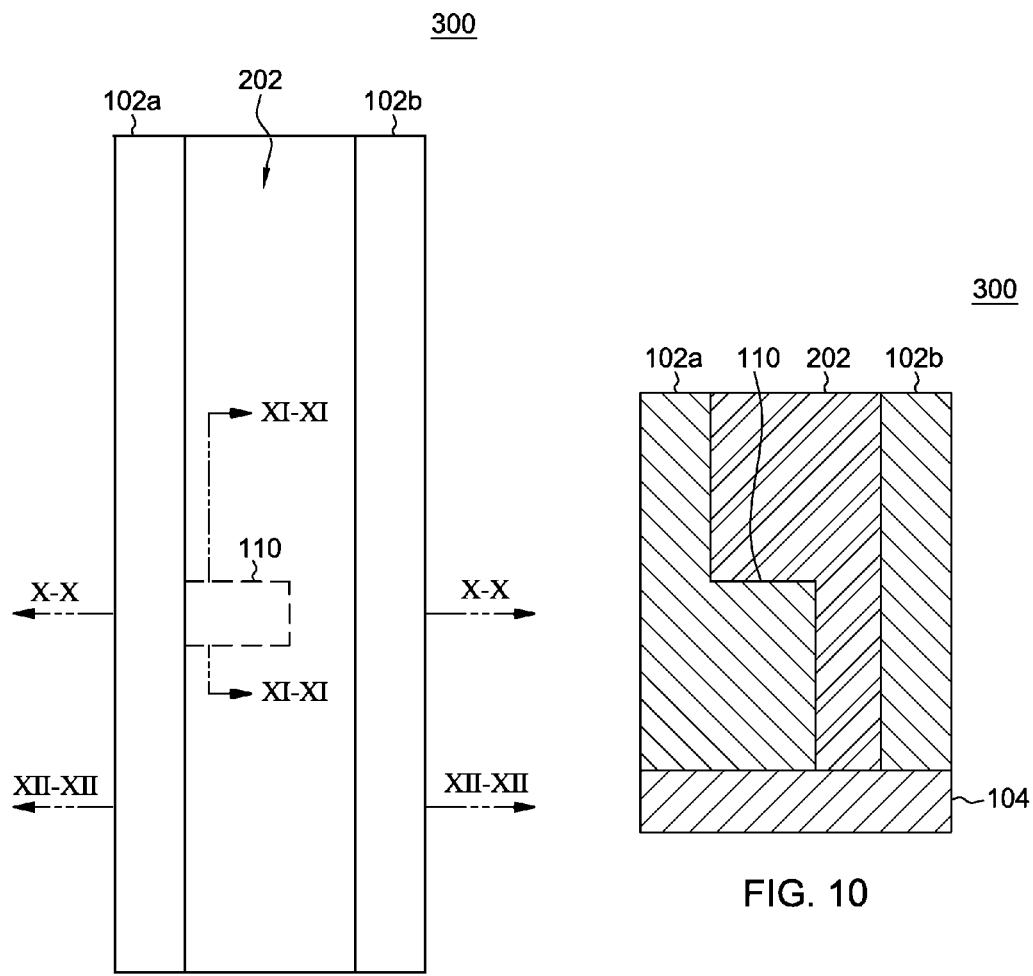
FIG. 9 is an orthographic top view of a first embodiment of a semiconductor structure according to the present invention as it is undergoing still further fabrication.
FIG. 10 is a transverse cross-sectional view (specifically a cross-sectional slice view showing only material present in the cutting plane shown on FIG. 9) of the first embodiment semiconductor structure as it is undergoing still further fabrication.
Figure 11:
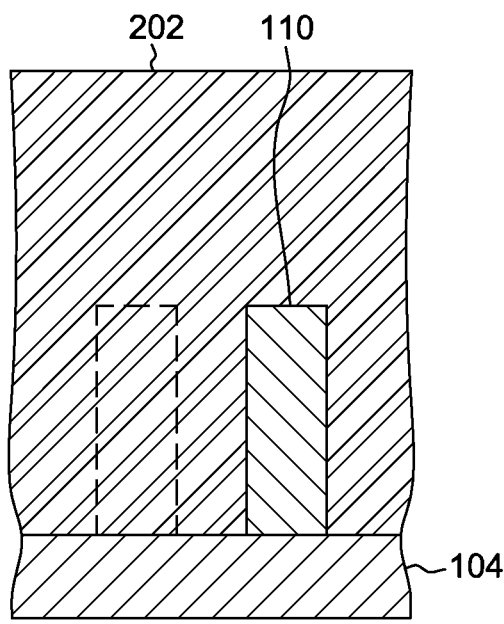
FIG. 11 is a longitudinal cross-sectional view of a portion of the first embodiment semiconductor structure as it is undergoing still further fabrication.
Figure 12:
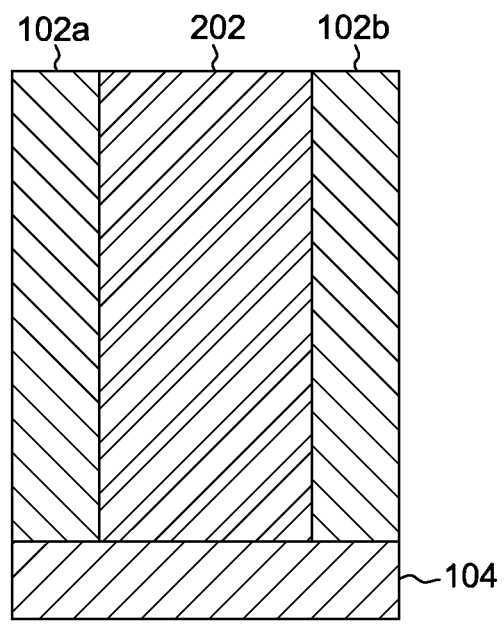
FIG. 12 is another transverse cross-sectional view (specifically a cross-sectional slice view showing only material present in the cutting plane shown on FIG. 9) of the first embodiment semiconductor structure as it is undergoing still further fabrication.

As shown in FIGS. 6, 7 and 8, the top surface of epitaxial layer 202 is not necessarily flat in epitaxially-grown intermediate sub-assembly 200, and this is due in part to the irregularities of the trench defining surface caused by defect-blocking members 107, 108, 110, and 112. However, in other (perhaps more preferred) embodiments, the epitaxial layer is grown so that it: (i) in some portions (for example, near the trench walls), reaches at least the level of the top plane of the trench; and (ii) in some portions (for example, away from the trench walls), extends above the top plane of the trench. In this embodiment, epitaxial layer 202 grows only bottom up from base sub-layer layer 104 and does not grow from aspect ratio trapping trench-defining sub-layer 102 (because sub-layer 102 is made from dielectric material in this example).

The role of defect-blocking member(s) set 107, 108, 110, 112 will now be discussed. As epitaxial layer 202 is epitaxially grown within the interior space of lower portion 106b of trench 106, any longitudinally-running defects caused by lattice mismatching will be stopped in their longitudinal direction propagation (that is, trench direction propagation) by the defect blocking members. This means that the defect propagation to the surface will be blocked, and a relatively defect-free surface will be accomplished so that performance of a semiconductor device made on this surface is not made less favorable by the defects (for example, defects caused by lattice mismatch between the materials of base sub-layer 104 and epitaxial layer 202).

As shown in FIGS. 9 to 12, planarized intermediate sub-assembly 300 includes: lateral wall sub-layer 102; base sub-layer 104; defect-blocking member 110; and epitaxial layer 202. In order to refine epitaxially-grown sub-assembly 200 into planarized sub-assembly, material is removed in a top down manner from sub-assembly 200, by chemical-mechanical planarization, until planarized intermediate sub-assembly 300 is obtained. Although FIG. 8 shows an example, where the epitaxial layer has not grown all the way to the top of the trench walls, at least some embodiments of the present invention: (i) grow the epitaxial layer above the height of the sidewalls; (ii) then CMP (chemical-mechanical-planarize) the structure using the top surface of the lateral wall sub-layer as a stopping plane for the downward removal of material by CMP; and (iii) resulting a structure where the top surface of the lateral wall sub-layer and the top surface of the epitaxial layer are co-planar. A device (for example, an NFET can later be built on the planarized top surface of epitaxial layer 202. To put it another way, epitaxial layer 202 may serve as a substrate for later building a semiconductor device.

Figure 14:
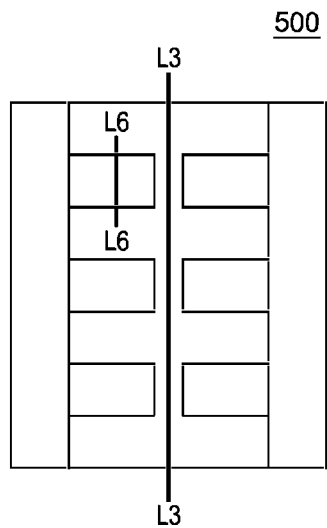
FIG. 14 is an orthographic top view of a second embodiment of a semiconductor structure according to the present invention as it is undergoing fabrication.
Figure 15:
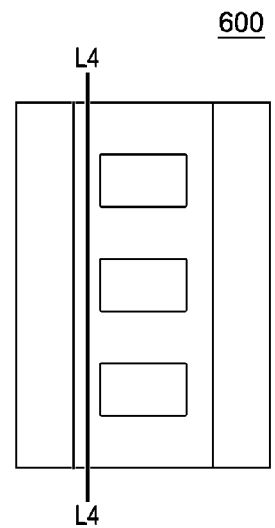
FIG. 15 is an orthographic top view of a third embodiment of a semiconductor structure according to the present invention as it is undergoing fabrication.
Figure 16:
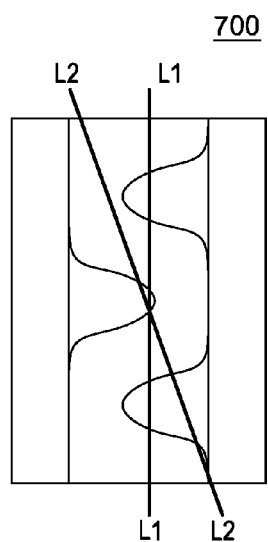
FIG. 16 is an orthographic top view of a fourth embodiment of a semiconductor structure according to the present invention as it is undergoing fabrication.
Figure 17:
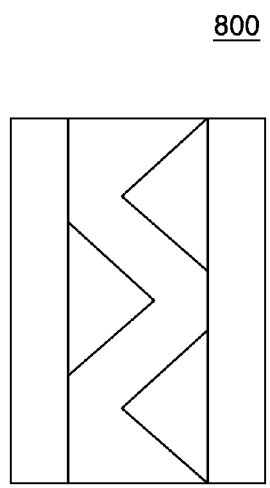
FIG. 17 is an orthographic top view of a fifth embodiment of a semiconductor structure according to the present invention as it is undergoing fabrication.
Figure 18:
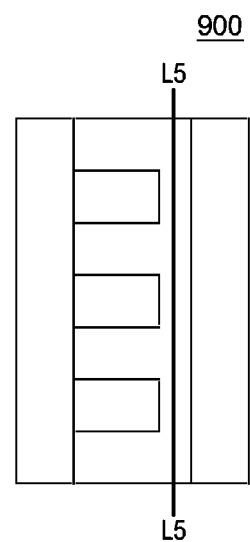
FIG. 18 is an orthographic top view of a sixth embodiment of a semiconductor structure according to the present invention as it is undergoing fabrication.

FIGS. 14 to 18 respectively show plan views, at the trench-cut intermediate sub-assembly stage, for a variety of alternative embodiments as follows: (i) FIG. 14 shows sub-assembly 500 with longitudinally-aligned defect blocking members; (ii) FIG. 15 shows sub-assembly 600 with defect blocking members that extend from the base of the trench, but do not extend from the lateral walls of the trench; (iii) FIG. 16 shows sub-assembly 700 with sinusoidal defect-blocking members; (iv) FIG. 17 shows sub-assembly 800 with saw tooth profile defect-blocking members; and (v) FIG. 18 shows sub-assembly 900 with defect-blocking members extending from one lateral trench wall, but not the other lateral trench wall.

Further with respect to sub-assembly 700 of FIG. 16, lines L1 and L2 show two examples of potential, generally-longitudinal defect paths. L1 is close to parallel to the lateral side walls of the trench, while L2 is only generally parallel to the side walls of the trench. The fact that these potential defect paths pass through the sinusoidal defect blocking members shows how the defect-blocking members can stop defect growth, during the growing of the epitaxial layer. Similarly, potential defect path L6 as shown in FIG. 14.

Further with respect to sub-assemblies 500, 600 and 900 respectively of FIGS. 14, 15 and 18, lines L3, L4 and L5 show examples of potential, generally-longitudinal defect paths that would not be stopped in their propagation by the defect-blocking members. This is a potential relative disadvantage of these embodiments, but they are included here to help demonstrate the full potential scope of the present invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above-similar cautions apply to the term "embodiment."

and/or: inclusive or; for example, A, B "and/or" C means that at least one of A or B or C is true and applicable.

What is claimed is:

1. A method of fabricating a device, the method comprising:
    forming a first trench within a trench-defining layer, the first trench including a pair of opposing lateral sidewalls and a bottom trench surface; and
    selectively removing material of the trench-defining layer from the bottom surface of the first trench to form a second trench thereunder, wherein the selectively removing of material of the trench-defining layer from the bottom trench surface includes leaving two portions of the trench-defining layer intact beneath the first trench, and wherein the at least two portions of the trench-defining layer define a pair of defect blocking members positioned within, and extending upwardly from, a bottom surface of the second trench,
    wherein the pair of defect-blocking members includes a first defect-blocking member laterally contacting a first sidewall of the second trench, and a second defect-blocking member contacting a second sidewall of the second trench opposing the first sidewall, wherein the first and second defect-blocking members form a zigzag pattern within the second trench.

2. The method of claim 1, wherein: the trench-defining layer includes a base sub-layer and a lateral wall sub-layer; the base sub-layer having a different material composition from the lateral sub-layer.

3. The method of claim 1, wherein the forming of the first and second trenches includes reactive ion etching portions of the trench-defining layer.

4. The method of claim 1, further comprising forming an epitaxial layer on the bottom surface and sidewalls of the second trench to fill the second trench and at least a portion of the first trench, wherein the epitaxial layer is located in portions of the second trench not occupied by the pair of defect blocking members.

5. The method of claim 4, wherein the epitaxial layer comprises a III-V semiconductor material.

6. The method of claim 4, further comprising planarizing a top surface of the epitaxial layer and the trench-defining layer after forming the epitaxial layer.

7. The method of claim 4, wherein forming a portion of the epitaxial layer on the pair of defect blocking members, such that the portion of the epitaxial layer formed on the pair of defect blocking members forms a pair of overlying defect-blocking members within the first trench and positioned on the pair of defect blocking members.

8. The method of claim 1, further comprising:
    forming a pair of masks on the bottom surface of the first trench before selectively removing material of the trench-defining layer from the bottom surface of the first trench to form the second trench; and
    removing the pair of masks after selectively removing material of the trench-defining layer from the bottom surface, wherein portions of the trench-defining layer positioned beneath the masks define the pair of defect-blocking members.

9. A method of forming a semiconductor device, the method comprising:
    forming a first trench within a trench-defining layer, the first trench including a pair of opposing lateral sidewalls and a bottom trench surface;
    selectively removing material of the trench-defining layer from the bottom surface of the first trench to form a second trench thereunder, wherein the selectively removing of material of the trench-defining layer from the bottom trench surface includes leaving a two portions of the trench-defining layer intact beneath the first trench, and wherein the at least two portions of the trench-defining layer define a pair of defect blocking members positioned within, and extending upwardly from, a bottom surface of the second trench,
    wherein the pair of defect-blocking members includes a first defect-blocking member laterally contacting a first sidewall of the second trench, and a second defect-blocking member contacting a second sidewall of the second trench opposing the first sidewall, wherein the first and second defect-blocking members form a zigzag pattern within the second trench; and
    forming an epitaxial layer on at least the bottom surface of the second trench, the sidewalls of the second trench, and an upper surface of the pair of defect blocking members to fill the second trench and at least a portion of the first trench, wherein a portion of the epitaxial layer includes a pair of overlying defect blocking members in the portion of the first trench and positioned on the upper surface of the pair of defect-blocking members, the pair of overlying defect-blocking members defining a zig-zag pattern in the first trench.

10. The method of claim 9, wherein the epitaxial layer comprises a III-V semiconductor material.

11. The method of claim 9, further comprising planarizing a top surface of the epitaxial layer and the trench-defining layer after forming the epitaxial layer.

12. The method of claim 9, further comprising:
    forming a pair of masks on the bottom surface of the first trench before selectively removing material of the trench-defining layer from the bottom surface of the first trench to form the second trench; and
    removing the pair of masks after selectively removing material of the trench-defining layer from the bottom surface, wherein portions of the trench-defining layer positioned beneath the masks define the pair of defect-blocking members.

* * * * *